United States Patent
Maiyuran et al.

(10) Patent No.: US 6,175,253 B1
(45) Date of Patent: Jan. 16, 2001

(54) FAST BI-DIRECTIONAL TRISTATEABLE LINE DRIVER

(75) Inventors: Subramaniam Maiyuran, Fair Oaks; Sanjay Dabral, Milpitas; Thu M. Do, Rancho Cordova; Scott E. Siers, Elk Grove; Mehrdad Mohebbi, Folsom, all of CA (US)

(73) Assignee: Intel Corporation, Santa Clara, CA (US)

( * ) Notice: Under 35 U.S.C. 154(b), the term of this patent shall be extended for 0 days.

(21) Appl. No.: 09/052,883

(22) Filed: Mar. 31, 1998

(51) Int. Cl.[7] .................. H03K 19/02; H03K 19/096; H03K 19/00
(52) U.S. Cl. .................. 326/86; 326/58; 326/97; 326/98
(58) Field of Search .................. 326/93, 95, 96, 326/97, 98, 56, 57, 58, 83, 86, 87, 121

(56) References Cited

U.S. PATENT DOCUMENTS 5,617,043 * 4/1997 Han et al. .................. 326/83

\* cited by examiner

*Primary Examiner*—Michael Tokar
*Assistant Examiner*—Daniel D. Chang
(74) *Attorney, Agent, or Firm*—Seth Z. Kalson (57) ABSTRACT

A driver to drive a bus with a pullup and a pulldown transistor according to a data signal during a drive phase and to charge or discharge the bus to intermediate voltage levels during a precondition phase using the pullup and pulldown transistors, the driver comprising a buffer and latch to latch the bus voltage at the end of a drive phase; a precondition circuit responsive to the latch to switch ON a pullup transistor at the beginning of a precondition phase when the bus voltage was LOW in the previous drive phase so as to charge the bus voltage to a first voltage less than a supply voltage, and to switch ON a pulldown transistor at the beginning of the precondition phase when the bus voltage was HIGH in the previous drive phase so as to discharge the bus voltage to a second voltage above ground.

39 Claims, 3 Drawing Sheets

FAST BI-DIRECTIONAL TRISTATEABLE LINE DRIVER

FIELD OF THE INVENTION

The present invention relates to driver circuits, and more particularly to fast bus drivers.

BACKGROUND

Traditional tristate drivers for bi-directional buses drive bus lines HIGH or LOW only after the clock and data signals become valid. Presetting the bus to voltages intermediate to HIGH and LOW during a preset cycle before valid data is to be asserted on the bus can improve performance, for when the data is valid, the driver need not drive the bus through the entire voltage range. Ideally, if the driver interfaces with a symmetric receiver, i.e., a receiver with a trip point half way between ground and the supply voltage, then the bus voltage should be preset to half the supply voltage during the preset cycle.

Various methods exist for presetting bus lines by using transistors other than the pullup or pulldown transistors in the drivers. However, these additional transistors need to be sized appropriately to draw enough current fast enough to charge or discharge the bus during a preset cycle. Therefore, it would be advantageous to preset the bus lines during the preset cycle without the need for additional transistors sized to drive the bus, and to do so without DC power being wasted during the preset cycle.

DETAILED DESCRIPTION

We begin with terminology. A two-element Boolean algebra is relevant to switching circuits. For any point in a circuit, the term LOW will denote a set of voltages that map into one of the two Boolean elements, and the term HIGH will denote a set of voltages that map into the other of the two Boolean elements. The particular mapping into Boolean elements depends upon the technology used, and may be different for different parts of a single circuit. To avoid dealing with set terminology, we shall say that a voltage is LOW (HIGH) if it belongs to the set LOW (HIGH). We also follow the convention that for any given point within a circuit, LOW voltages are less than HIGH voltages.

A transmission line will refer to any physical medium and structure for the guided propagation of electromagnetic waves, i.e., a transmission line is a waveguide. A port may be identified as the intersection of a two dimensional surface with a waveguide, and is usually, although not necessarily, taken as the intersection of the waveguide with a plane perpendicular to the propagation direction along the waveguide. It is well known in electromagnetic theory that a voltage at a port is defined in terms of the value of the electric field vector associated with a propagating electromagnetic wave at the location of the port. By a terminal, or node, we shall mean a portion of a conducting line, which constitutes only part of a transmission line or waveguide. By a voltage at a terminal or node, we mean the voltage at some port in which the terminal or node forms part of the port.

By a port or terminal receiving an electromagnetic wave or signal, we mean that a port (or terminal forming part of the port) is electromagnetically coupled to a transmission line so that an electromagnetic wave is excited in the port in response to an electromagnetic wave propagating in the transmission line toward the port. In practice, however, there will be some mismatch between the transmission line and the port, so that there will be a reflected wave, and the wave excited in the port will not have the identical waveform as that of the incident wave from the transmission line.

Figure 1:
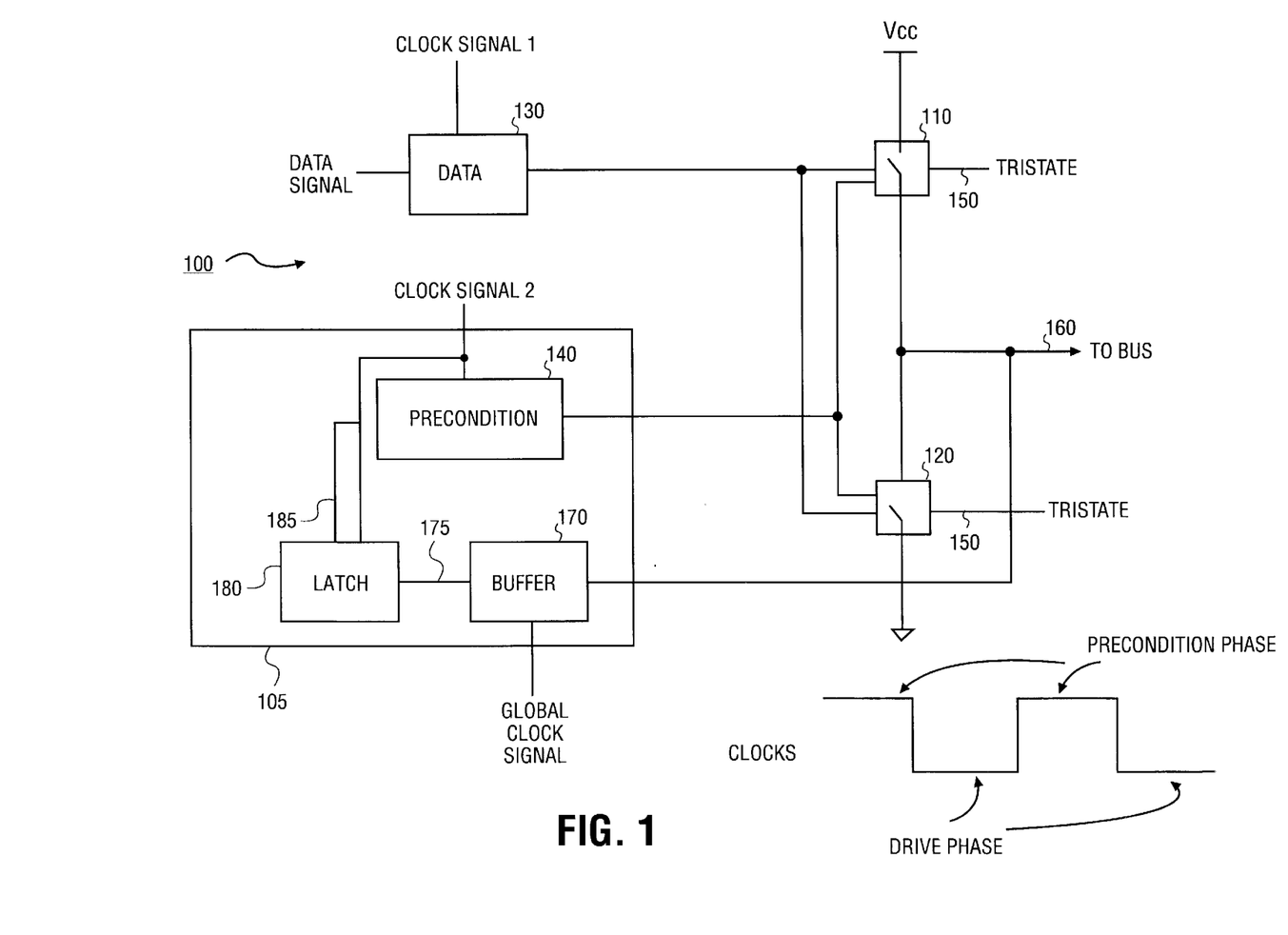
FIG. 1 is a high level diagram of an embodiment.

Diagram 100 in FIG. 1 illustrates a high level abstraction of a driver circuit, in which the paths between the functional units illustrated in FIG. 1 may represent either actual wires carrying signals or abstract control dependencies among functional units. As will be explained in more detail below, driver 100 behaves as a conventional bus driver when clock signals 1 and 2 are each in a drive phase. However, when clock signals 1 and 2 are each in a precondition phase, functional units 110 and 120 are responsive to control functional unit 105 in such a way as to either discharge the bus from $V_{cc}$ to a first voltage if the driver output voltage was greater than $V_{cc}/2$ at the end of a drive phase of a global clock signal, or charge the bus from ground to a second voltage if the driver output voltage was less than $V_{cc}/2$ at the end of the drive phase, where the first and second voltages are between $V_{cc}$ and ground.

Functional units 110 and 120 represent switches controlled by data functional unit 130, control functional unit 105, and a tristate signal at lines 150. With switch functional unit 110 ON and switch functional unit 120 OFF, the voltage at output 160 is driven toward some supply voltage $V_{cc}$, which we refer to as HIGH. With switch 110 OFF and switch 120 ON, the voltage at output 160 is driven toward ground, which we refer to as LOW. Not shown is a bus line connected to output 160. Other drivers and receivers may be connected to the bus line.

The global clock signal and clock signals 1 and 2 control the functional units as shown in FIG. 1. Clock signals 1 and 2 may be derived from the global clock signal, or may be synchronized with each other. In another embodiment, clock signals 1 and 2 may actually be the same signal. A data signal provides digital data to data functional unit 130, and should be valid when all clock signals are in their drive phases.

When the driver is "tristated", or in its "tristate" state, the tristate signal on lines 150 is such as to cause switch functional units 110 and 120 to be OFF regardless of the state of the other functional units, so that the driver presents a very high impedance to its output.

We now consider the operation of driver 100 when not tristated. When the clock signals 1 and 2 are each in a drive phase, switches 110 and 120 are controlled by data functional unit 130, and will switch ON and OFF in response to the data signal. When the data signal is in one state, switch 110 is ON and switch 120 is OFF to drive the output HIGH. When the data signal is in a second state, switch 110 is OFF and switch 120 is ON to drive the output LOW. Thus, when clock signals 1 and 2 are in their drive phases, the driver output voltage is indicative of the data signal, and driver 100 operates as a conventional bus driver.

When clock signals 1 and 2 are each in a precondition phase, however, switches 110 and 120 are operated in such a way as to either charge or discharge a bus connected to output 160 according to whether the bus was either HIGH or LOW in a drive phase of the global clock signal. When clock signals 1 and 2 are each in a precondition phase, the bus should ideally be driven to $V_{cc}/2$, however, in practical embodiments, during the precondition phase the bus will be driven to either a first voltage or second voltage, where the first and second voltages are somewhere between $V_{cc}$ (HIGH) and ground (LOW). This is now explained in more detail below, where at a lower level of abstraction, control functional unit 105 comprises functional unit 170, latch functional unit 180, and precondition functional unit 140.

When the global clock signal is in a drive phase, functional unit 170 provides a logic level on line 175 indicative of the voltage at output 160. For example, with the global clock signal in a drive phase, functional unit 170 holds line 175 HIGH if the voltage at output 160 is less than $V_{cc}/2$, and holds line 175 LOW if the voltage at output 160 is greater than $V_{cc}/2$. Without loss of generality, "175 HIGH" and "175 LOW" may be interchanged in the preceding sentence, for any final complementary function may be performed by the other functional units between functional unit 170 and switch 120. In general, by "A" indicative of "B", we mean that "A" is essentially a memoryless function of "B". Therefore, at the level of abstraction represented by FIG. 1, it is only necessary to state that the logic level of line 175 is essentially a memoryless function of the voltage at output 160.

When the global clock signal is in a precondition phase, functional unit 170 presents an "open circuit" (i.e., very high impedance) to line 175.

Latch functional unit 180 provides on line 185 a logic level indicative of the logic level at line 175 when clock signal 2 transitions from a drive phase to a precondition phase. In other words, the logic level on line 185 is latched to the voltage on line 175 when clock signal 2 transitions from a drive phase to a precondition phase.

Figure 2:
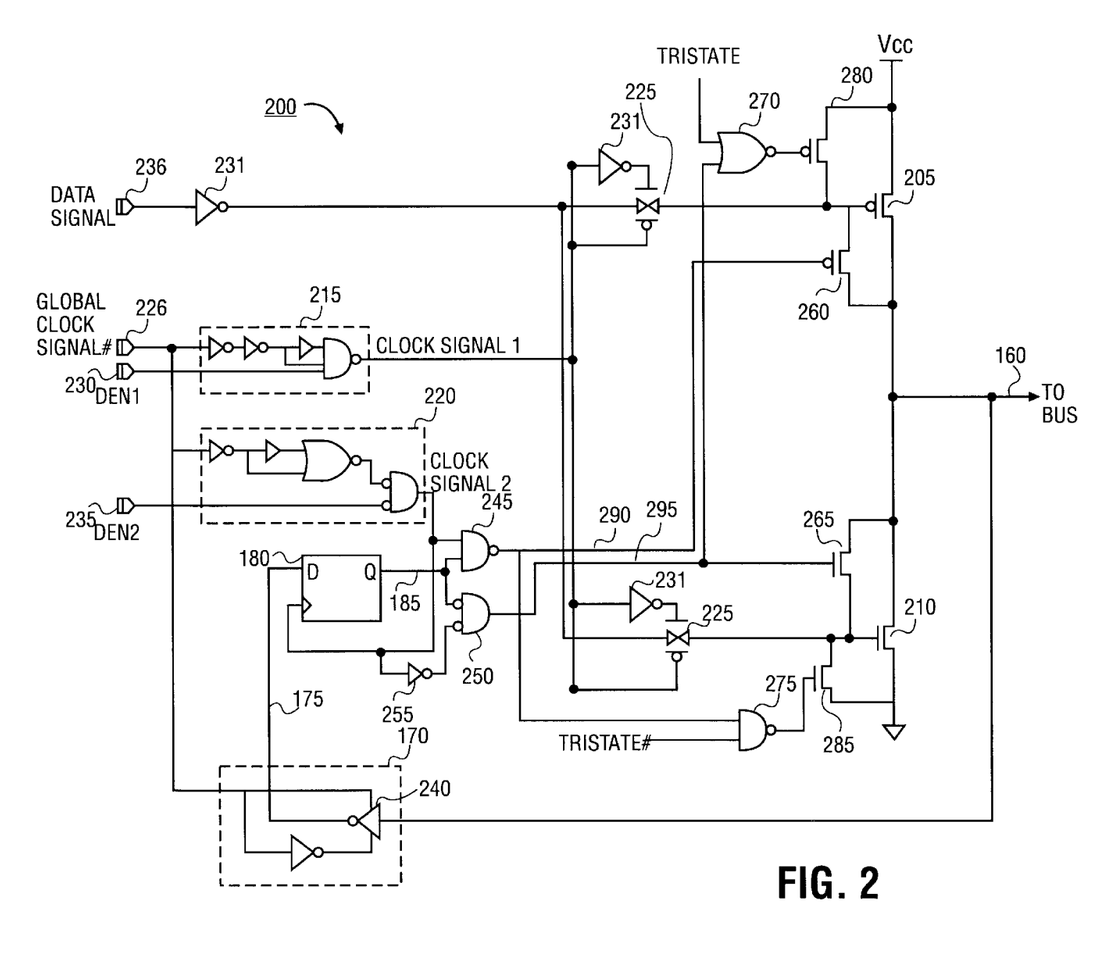
FIG. 2 is a circuit diagram of an embodiment.
Figure 3:
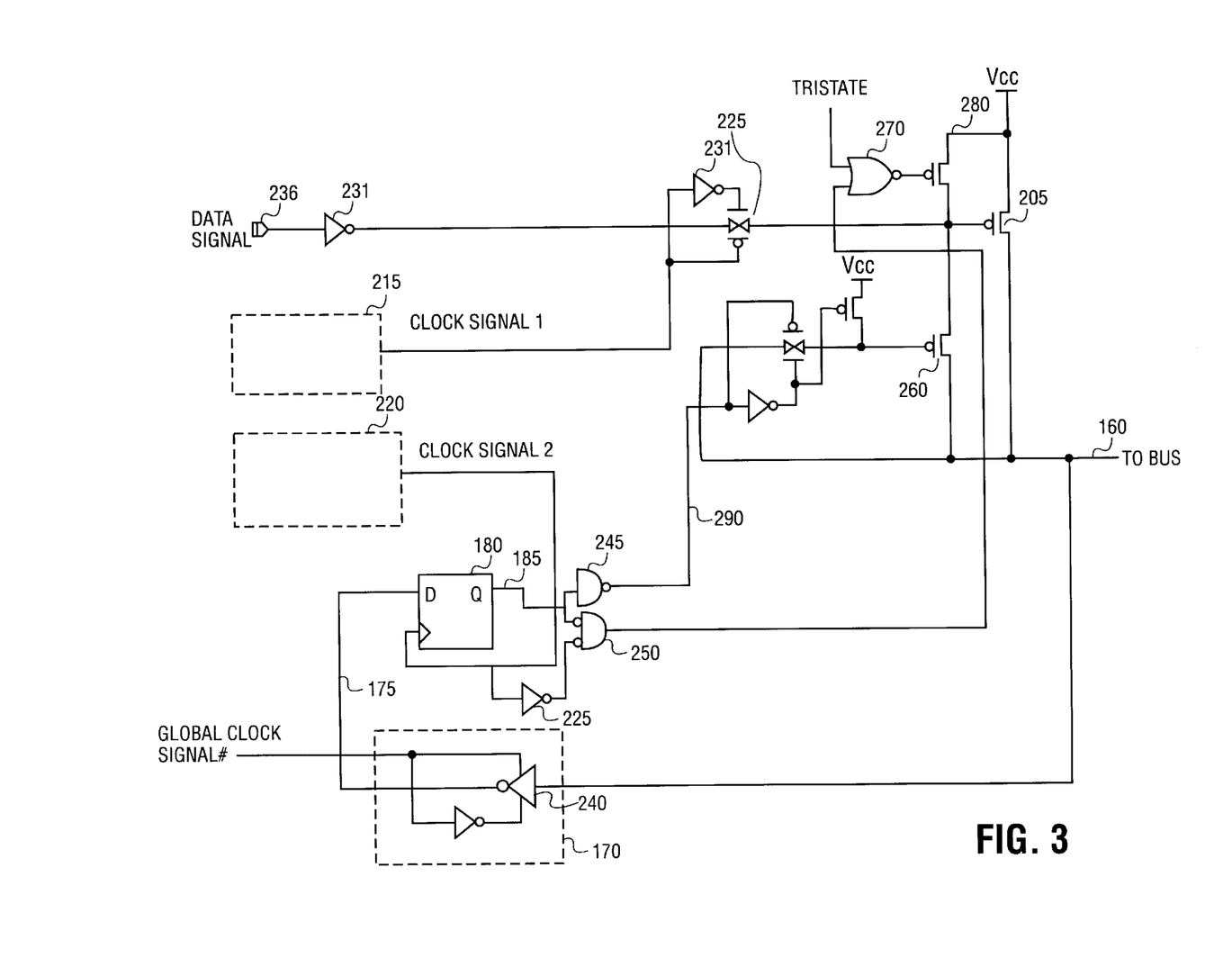
FIG. 3 is a sub-circuit diagram for modifying the circuit diagram of FIG. 2.

With clock signal 2 in its precondition phase, line 185 will be latched to a voltage indicative of the voltage at output 160 at the end of the global clock signal's drive phase. Precondition functional unit 140 will then cause switch 110 to be ON and switch 120 to be OFF if the voltage at line 185 is indicative of the voltage at output 160 having been LOW, so as to charge the bus line. Similarly, precondition functional unit 140 will cause switch 110 to be OFF and switch 120 to be ON if the voltage at line 185 is indicative of the voltage at output 160 having been HIGH, so as to discharge the bus line. However, switches 110 and 120 will be held ON or OFF in such a way that the bus line will be charged to some voltage less than $V_{cc}$ and will be discharged to some voltage greater than ground. This can be accomplished by reducing the length of time for which the switches are ON. DEN2 235 can control this charge and discharge time. FIGS. 2 and 3 provide embodiments for setting the voltages during the preset cycle. In practice, optimum voltages for presetting the bus are chosen to minimize signal delay between the driver and receivers.

Referring now to driver 200 in FIG. 2, pullup transistor 205 drives output 160 toward $V_{cc}$ when ON and pulldown transistor 210 drives output 160 toward ground when ON. The complement of the global clock signal is applied to node 226, as indicated by the symbol # after "global clock signal". The circuit within block 215 generates clock signal 1 and the circuit within block 220 generates clock signal 2. Nodes 230 and 235 are data enable nodes, where node 230 is held HIGH to enable clock signal 1 and node 235 is held LOW to enable clock signal 2.

Transmission gates 225 and inverters 231 can be identified with data functional unit 130 of FIG. 1, and allow a data signal applied to node 236 to drive a bus connected to driver output 160. Functional unit 170 and line 175 are identified in FIG. 2, where inverter 240 drives line 175 HIGH when output 160 is LOW and the global clock signal is LOW (in its drive phase), drives line 175 LOW when output 160 is HIGH and the global clock signal is LOW, and presents an open circuit to line 175 when the global clock signal is HIGH (in its precondition phase). Latch functional unit 180 and line 185 are also identified in FIG. 2. Latch 180 latches on the rising edge of clock signal 2 (corresponding to clock signal 2 transitioning from its drive phase to its precondition phase).

Logic gates 245 and 250, and inverter 255 are identified with precondition functional unit 140 of FIG. 1. In addition, precondition charging transistor 260 and precondition discharging transistor 265 may be considered to be part of precondition functional unit 140, or they may be considered as part of switch functional units 110 and 120, respectively. A tristate signal, denoted by Tristate, and its complement, denoted as Tristate#, are applied to logic gates 270 and 275, respectively. When Tristate is HIGH, switching transistor 280 is ON, thereby holding pullup transistor 205 OFF, and switching transistor 285 is ON, thereby holding pulldown transistor 210 OFF. When driver 200 is tristated, DEN1 230 should be held LOW and DEN2 235 should be held HIGH so that transmission gates 225, pMOSFET 260, and nMOSFET 265 are held OFF. When tristated, driver 200 presents an open circuit at output 160.

We now consider the operation of driver 200 when Tristate is LOW. Consider the case in which both clock signals 1 and 2 are in their drive phases (i.e., both are LOW). Clock signal 1 LOW will enable transmission gates 225. Clock signal 2 LOW will cause charging line 290 to be HIGH and discharging line 295 to be LOW, which holds transistors 280, 260, 265, and 285 OFF. Thus, driver 200 will operate as a conventional driver, driving the bus according to the data signal. During the drive phase, when Tristate is LOW, DEN1 230 should be held HIGH and DEN2 235 should be LOW.

Consider the case in which all clock signals are initially in their drive phases. As discussed above, driver 200 will be in its "conventional" mode. The global clock signal being LOW will cause functional unit 170 to drive line 175 to the complement of the voltage at output 160. Because of the delays introduced by circuit blocks 215 and 220, the global clock signal will transition to HIGH (its precondition phase) before clock signals 1 and 2 transition HIGH. When this happens, the voltage at 175 will stay at the complement of the driver output voltage for a short while because of the capacitance effect of gates within latch 180 and functional unit 170 will present a high impedance, thereby decoupling the bus from latch 180. Shortly after the global clock signal transitions HIGH, clock signal 2 will transition HIGH (its precondition phase), which will cause latch 180 to latch the voltage on line 185 to the voltage on 175, which is the complement of the driver voltage as it was just before clock signal 2 transitioned HIGH. Both charging line 290 and discharging line 295 will be at the same logic level as the driver output voltage was just before the transition (i.e., the driver output voltage at the end of the drive phase of the global clock signal).

Suppose that the driver output voltage was LOW just before the clock transition. Transistor 265 will be OFF and transistor 285 will be ON, which keeps transistor 210 OFF. Transistor 280 will be OFF and transistor 260 will be ON, which causes transistor 205 to be held ON because transistor 260 will provide feedback from output 160 (which is initially LOW) to the gate of transistor 205. With transistor 205 ON, the driver output voltage will rise. However, it cannot rise above approximately $V_{cc}-V_{th}$, where $V_{th}$ is the threshold voltage of transistor 205, because transistor 205 will be held OFF if its gate voltage, which is tied to the driver output voltage via transistor 260, rises above $V_{cc}-V_{th}$. Thus, driver 200 can charge the bus line approximately to $V_{cc}-V_{th}$, but the bus line can be charged to less than $V_{cc}-V_{th}$ if DEN2 235 is brought HIGH before the precondition phase is over. Similar reasoning applied to the case in which the driver output voltage was HIGH just before the clock transition will show that driver 200 charges (or more precisely, discharges) the bus line to the threshold voltage of transistor 210. However, the bus line will discharge to a voltage above the threshold voltage of transistor 210 if DEN2 235 is brought HIGH before the precondition phase is over.

FIG. 3 shows a partial circuit that is a modification to the circuit of FIG. 2. Essentially, we see from FIG. 3 that the gate of pMOSFET 260, instead of being connected to logic gate 245 as in FIG. 2, is coupled to node 160 via a feedback path which is controlled by logic gate 245. A similar modification is to be made to nMOSFET 265 of FIG. 2. The operation of the circuit of FIG. 3 is similar to that of the circuit of FIG. 2, except that when line 290 is LOW, the gate voltage of pMOSFET 260 follows the voltage of output node 160.

Suppose that during the precondition phase, output node 160 was previously LOW, so that line 290 is held LOW. Then, both pullup pMOSFET 205 and pMOSFET 260 are switched ON to charge output node 160. However, the gate voltage of pMOSFET 205 cannot be pulled up above $V_{cc}-V_{th}$, and therefore the gate of pMOSFET 260 cannot be brought above $V_{cc}-2V_{th}$ (for simplicity of discussion only, we assume that pMOSFET 260 and pMOSFET 205 have equal threshold voltages). However, because of the feedback path between node 160 and the gate of pMOSFET 260, we see that node 160 cannot be pulled above $V_{cc}-2V_{th}$. A similar modification to nMOSFET 265 provides an embodiment in which during the precondition phase node 160 is not pulled down below the sum of the threshold voltages of nMOSFETs 265 and 210.

In FIG. 2, blocks 215 and 220 are used to derive clock signals 1 and 2 from the global clock signal so as to prevent race conditions. In the particular embodiment of FIG. 2, clock signal 2 is slightly delayed relative to the global clock signal (its precondition phase is also slightly stretched), so that the global clock signal transitions from its drive phase to its precondition phase just before clock signal 2 does. This may result in functional unit 170 being brought into its high impedance state just before clock signal 2 triggers functional unit 180 to latch. However, in CMOS technology, there will be enough capacitance on line 175 to hold a voltage on line 175 for a short while (relative to a clock cycle) when functional unit 170 goes into its high impedance state, so that functional unit 180 latches to the correct voltage. If there is not enough capacitance on line 175, a keeper circuit can be applied to line 175, or equivalently, can be "built" into latch functional unit 180. Thus, the voltage at line 185 when clock signal 2 transitions to some given precondition phase will be indicative of the driver output voltage at output 160 at the end of the global clock signal's driver phase previous in time to the given precondition phase.

Various modifications may be made to the embodiments discussed above without departing from the scope of the invention as claimed below. Embodiments may be realized in which there is no global clock signal as long as the charging and discharging is based upon the drive phase immediately preceding the precondition phase. The use of clock signals 1 and 2 derived from a global clock signal is one way to perform this function.

Furthermore, other embodiments may be realized by inserting additional devices between various nodes, terminals, and devices in the above embodiments without materially changing their overall function. For example, voltage drops may be introduced by diodes, or transistors configured as diodes, to change various voltage levels, or buffers may be inserted between various nodes, terminals, and devices.

For this reason, we give a precise definition to connection. We say that for any objects A and B in which a voltage is well defined, an object A is connected to an object B if they are connected by a low resistance transmission line, or waveguide, (which may comprise any conducting material) in which any lumped or distributed resistance, capacitance, and inductance due to the connection may be neglected for the frequency range in which the device comprising objects A and B is to operate. That is, the voltage of object A is essentially the same as the voltage of object B. As discussed previously, it will be understood from context that a ground wire, plane, substrate, or other conducting material, may comprise part of the transmission line or waveguide connecting object A to object B.

If objects A and B are coupled to each other, then they may be connected to each other as discussed above, or other means may be employed for relating the voltages of objects A and B. For these letters patent, we shall define a relationship between voltages as follows. Let $f$ denote a function mapping the Reals $\Re$ into the Reals $\Re$. Let there exist intervals (a,b) and (c,d), where a, b, c, and d are real, a<b and c<d, and for which $f$ maps (a,b) onto (c,d) and is strictly increasing on (a,b). By strictly increasing, we mean that $f(x)<f(y)$ for x<y where x ∈ (a,b) and y ∈ (a,b). It follows that $f$ is one-to-one over (a,b), and therefore has an inverse, which we denote by g. It also follows that g maps (c,d) onto (a,b) and is strictly increasing on (c,d). We then say that the voltages of objects A and B are related by an increasing function if there exists such an $f$ and intervals (a,b) and (c,d) for which z=$f$(w) where z is the voltage of object A, w is the voltage of object B, and z ∈ (c,d) and w ∈ (a,b). If we denote this relation by A≈B, then because g has similar properties to $f$ as just discussed, we see that A≈B if and only if B≈A so that the relationship so defined is a symmetric relationship.

In practice, $f$ is actually a function of more than one variable. For convenience, let these variables be grouped together into the variable α and denote its space by $\aleph$. The function $f$ is then a function mapping the space of $\Re \times \aleph$ into $\Re$. Then we say that the voltages of objects A and B are related by an increasing function if the properties discussed in the previous paragraph hold for some α=α*. Again, this relationship is symmetric.

What is claimed is:

1. A driver circuit to drive an output node LOW and HIGH in response to an input voltage only if a clock signal is in its drive phase, the clock signal having drive and precondition phases, the driver circuit comprising:
   a pullup pMOSFET to pull the output node HIGH; and
   a pulldown nMOSFET to pull the output node LOW;
   wherein for a precondition phase, the pullup pMOSFET charges the output node to a charge voltage only if the output node was LOW in a drive phase immediately preceding said precondition phase, and the pulldown nMOSFET discharges the output node to a discharge voltage only if the output node was HIGH in said drive phase immediately preceding said precondition phase.

2. The driver circuit as set forth in claim 1, further comprising:
   a precondition pMOSFET coupled to switch the pullup pMOSFET ON during said precondition phase only if the output node was LOW in said drive phase immediately preceding said precondition phase; and
   a precondition nMOSFET coupled to switch the pulldown nMOSFET ON during said precondition phase only if the output node was HIGH in said drive phase immediately preceding said precondition phase.

3. The driver circuit as set forth in claim 2, further comprising:
   a control circuit coupled to the output node to provide during said precondition phase a control voltage indicative of the output node voltage at a time during said drive phase immediately preceding said precondition phase, wherein the precondition pMOSFET and the precondition nMOSFET are responsive to the control voltage so as to, respectively, switch the pullup pMOS- FET ON during said precondition phase only if the output node was LOW in said drive phase immediately preceding said precondition phase and switch the pulldown nMOSFET ON during said precondition phase only if the output node was HIGH in said drive phase immediately preceding said precondition phase.

4. The driver circuit as set forth in claim 2, wherein
the precondition pMOSFET source voltage and the pullup pMOSFET gate voltage are related by an increasing function, and the precondition pMOSFET drain voltage and the pullup pMOSFET drain voltage are related by an increasing function;
the precondition nMOSFET source voltage and the pulldown nMOSFET gate voltage are related by an increasing function, and the precondition nMOSFET drain voltage and the pulldown nMOSFET drain voltage are related by an increasing function;
the pullup pMOSFET drain voltage and the output node voltage are related by an increasing function; and
the pulldown nMOSFET drain voltage and the output node voltage are related by an increasing function.

5. The driver circuit as set forth in claim 3, wherein
the precondition pMOSFET source voltage and the pullup pMOSFET gate voltage are related by an increasing function, and the precondition pMOSFET drain voltage and the pullup pMOSFET drain voltage are related by an increasing function; and
the precondition nMOSFET source voltage and the pulldown nMOSFET gate voltage are related by an increasing function, and the precondition nMOSFET drain voltage and the pulldown nMOSFET drain voltage are related by an increasing function;
the pullup pMOSFET drain voltage and the output node voltage are related by an increasing function; and
the pulldown nMOSFET drain voltage and the output node voltage are related by an increasing function.

6. The driver circuit as set forth in claim 4, wherein
the precondition pMOSFET source is connected to the pullup pMOSFET gate, and the precondition pMOSFET drain is connected to the pullup pMOSFET drain so that the charge voltage does not exceed $V_{cc}-V_{thp}$, where $V_{cc}$ is the pullup pMOSFET source voltage and $V_{thp}$ is the threshold voltage of the pullup pMOSFET; and
the precondition nMOSFET source is connected to the pulldown nMOSFET gate, and the precondition nMOSFET drain is connected to the pulldown nMOSFET drain so that the discharge voltage does not fall below $V_{thn}$, where the pulldown nMOSFET source voltage is at ground and $V_{thn}$ is the threshold voltage of the pulldown nMOSFET.

7. The driver circuit as set forth in claim 5, wherein
the precondition pMOSFET source is connected to the pullup pMOSFET gate, and the precondition pMOSFET drain is connected to the pullup pMOSFET drain so that the charge voltage does not exceed $V_{cc}-V_{thp}$, where $V_{cc}$ is the pullup pMOSFET source voltage and $V_{thp}$ is the threshold voltage of the pullup pMOSFET; and
the precondition nMOSFET source is connected to the pulldown nMOSFET gate, and the precondition nMOSFET drain is connected to the pulldown nMOSFET drain so that the discharge voltage does not fall below $V_{thn}$, where the pulldown nMOSFET source voltage is at ground and $V_{thn}$ is the threshold voltage of the pulldown nMOSFET.

8. The driver circuit as set forth in claim 4, wherein
the precondition pMOSFET source is connected to the pullup pMOSFET gate, the precondition pMOSFET drain is connected to the pullup pMOSFET drain, and the precondition pMOSFET gate is coupled to the output node so that the precondition pMOSFET gate voltage and the output node voltage are related by an increasing function provided the output node was driven LOW during said drive phase immediately preceding said precondition phase; and
the precondition nMOSFET source is connected to the pulldown nMOSFET gate, the precondition nMOSFET drain is connected to the pulldown nMOSFET drain, and the precondition nMOSFET gate is coupled to the output node so that the precondition nMOSFET gate voltage and the output node voltage are related by an increasing function provided the output node was driven HIGH during said drive phase immediately preceding said precondition phase.

9. The driver circuit as set forth in claim 5, wherein
the precondition pMOSFET source is connected to the pullup pMOSFET gate, the precondition pMOSFET drain is connected to the pullup pMOSFET drain, and the precondition pMOSFET gate is coupled to the output node so that the precondition pMOSFET gate voltage and the output node voltage are related by an increasing function provided the control voltage is indicative of the output node being driven LOW during said drive phase immediately preceding said precondition phase; and
the precondition nMOSFET source is connected to the pulldown nMOSFET gate, the precondition nMOSFET drain is connected to the pulldown nMOSFET drain, and the precondition nMOSFET gate is coupled to the output node so that the precondition nMOSFET gate voltage and the output node voltage are related by an increasing function provided the control voltage is indicative of the output node being driven HIGH during said drive phase immediately preceding said precondition phase.

10. The driver circuit as set forth in claim 9, wherein
the charge voltage does not exceed $V_{cc}-V_{thp}(1)-V_{thp}(2)$, where $V_{cc}$ is the pullup pMOSFET source voltage, $V_{thp}(1)$ is the threshold voltage of the pullup pMOSFET, and $V_{thp}(2)$ is the threshold voltage of the precondition pMOSFET; and
the discharge voltage does not fall below $V_{thn}(1)-V_{thn}(2)$, where the pulldown nMOSFET source is at ground potential, $V_{thn}(1)$ is the threshold voltage of the pulldown nMOSFET, and $V_{thn}(2)$ is the threshold voltage of the precondition nMOSFET.

11. A driver circuit comprising:
an output node;
a pullup pMOSFET to drive the output node HIGH;
a pulldown nMOSFET to drive the output node LOW;
a precondition pMOSFET to provide feedback between the output node and the gate of the pullup pMOSFET;
a precondition nMOSFET to provide feedback between the output node and the gate of the pulldown nMOSFET; and
a control circuit coupled to the precondition pMOSFET to switch the precondition pMOSFET ON so as to switch the pullup pMOSFET ON provided the output node was driven LOW, and coupled to the precondition nMOSFET to switch the precondition nMOSFET ON so as to switch the pulldown nMOSFET ON provided the output node was driven HIGH.

12. The driver circuit as set forth in claim 11, wherein the precondition pMOSFET source voltage and the pullup pMOSFET gate voltage are related by an increasing function, the precondition pMOSFET drain voltage and the pullup pMOSFET drain voltage are related by an increasing function, and the pullup pMOSFET drain voltage and the output node voltage are related by an increasing function; and the precondition nMOSFET source voltage and the pulldown nMOSFET gate voltage are related by an increasing function, the precondition nMOSFET drain voltage and the pulldown nMOSFET drain voltage are related by an increasing function, and the pulldown nMOSFET drain voltage and the output node voltage are related by an increasing function.

13. The driver circuit as set forth in claim 11, wherein the precondition pMOSFET source is connected to the pullup pMOSFET gate, and the precondition pMOSFET drain and the pullup pMOSFET drain are connected to the output node; and the precondition nMOSFET source is connected to the pulldown nMOSFET gate, and the precondition nMOSFET drain and the pulldown nMOSFET drain are connected to the output node.

14. The driver circuit as set forth in claim 13, wherein the charge voltage does not exceed $V_{cc}-V_{thp}$, where $V_{cc}$ is the pullup pMOSFET source voltage and $V_{thp}$ is the threshold voltage of the pullup pMOSFET; and the discharge voltage does not fall below $V_{thn}$, where the pulldown nMOSFET source voltage is at ground and $V_{thn}$ is the threshold voltage of the pulldown nMOSFET.

15. The driver circuit as set forth in claim 11, wherein the control circuit provides feedback from the output node to the precondition pMOSFET gate to switch the pullup pMOSFET ON; and the control circuit provides feedback from the output node to the precondition nMOSFET gate to switch the pulldown nMOSFET ON.

16. The driver circuit as set forth in claim 12, wherein the control circuit provides feedback from the output node to the precondition pMOSFET gate so that the pMOSFET gate voltage and the output node voltage are related by an increasing function; and the control circuit provides feedback from the output node to the precondition nMOSFET gate so that the nMOSFET gate voltage and the output node voltage are related by an increasing function.

17. A driver circuit comprising:
an input terminal;
an output node;
a pullup pMOSFET to drive the output node HIGH in response to the input terminal voltage only if a clock signal is in its drive phase;
a pulldown nMOSFET to drive the output node LOW in response to the input terminal voltage only if the clock signal is in its drive phase; and
a latch circuit to latch the output node voltage;
wherein, provided the signal clock is in its precondition phase, the pullup pMOSFET is coupled to the latch circuit to switch ON only if the latch circuit latches the output node voltage when LOW and the pulldown nMOSFET is coupled to the latch circuit to switch ON only if the latch circuit latches the output node voltage when HIGH.

18. The driver circuit as set forth in claim 17, wherein the pullup pMOSFET drain voltage is an increasing function of the output node voltage and the pullup nMOSFET drain voltage is an increasing function of the output node voltage, the driver circuit further comprising:
a precondition pMOSFET to provide a feedback path between the output node and the pullup pMOSFET gate only if the precondition pMOSFET is ON; and
a precondition nMOSFET to provide a feedback path between the output node and the pulldown nMOSFET gate only if the precondition nMOSFET is ON;
wherein, provided the clock signal is in its precondition phase, the precondition pMOSFET is coupled to the latch circuit to switch ON only if the latch circuit latches the output node voltage when LOW and the precondition nMOSFET is coupled to the latch circuit to switch ON only if the latch circuit latches the output node voltage when HIGH.

19. The driver circuit as set forth in claim 18, wherein, provided the clock signal is in its precondition phase, feedback is provided from the output node to the precondition pMOSFET gate only if the latch circuit latched the output node voltage when LOW and feedback is provided from the output node to the precondition nMOSFET gate only if the latch circuit latched the output node voltage when HIGH.

20. A driver circuit, having an input to receive a digital data signal with first and second states, having a driver output, and responsive to a first clock signal having a drive phase state and a precondition phase state, the driver circuit comprising:
a pullup transistor to drive the driver output HIGH only if the first clock signal is in its drive phase state and only if the digital data signal is in its first state;
a pulldown transistor to drive the driver output LOW only if the first clock signal is in its drive phase state and only if the digital data signal is in its second state; and
a control circuit:
to hold the pullup transistor ON and the pulldown transistor OFF to drive the driver output to a first voltage between HIGH and LOW when the first clock signal is in a precondition phase, only if the driver output voltage was LOW for a portion of time in which the first clock signal was in a drive phase immediately preceding the precondition phase; and
to hold the pullup transistor OFF and the pulldown transistor ON to drive the driver output to a second voltage between HIGH and LOW when the first clock signal is in the precondition phase, only if the drive output voltage was HIGH for a portion of time in which the first clock signal was in the drive phase immediately preceding the precondition phase.

21. The driver circuit as set forth in claim 20, wherein the driver circuit is responsive to a global clock signal having a drive phase state and a precondition phase state and is responsive to a second clock signal having a drive phase state and a precondition phase state, wherein the control circuit further comprises:
a buffer circuit, having an output, connected to the driver output to provide on the buffer circuit output a voltage indicative of the driver output voltage only if the global clock signal is in its drive phase state and to provide on the buffer circuit output an open circuit only if the global clock signal is in its precondition phase state;
a latch circuit to generate a digital output signal, the digital output signal being latched to the buffer circuit's output voltage only if the second clock signal transitions from its drive phase state to its precondition phase state; and a precondition circuit to hold the pullup transistor ON and the pulldown transistor OFF to drive the driver output to the first voltage only if the first and second clock signals are each in their precondition phase states and only if the latch circuit's digital output signal is latched to a voltage on the buffer circuit output indicative of a LOW driver output voltage, and to hold the pullup transistor OFF and the pulldown transistor ON to drive the driver output to the second voltage only if the first and second clock signals are each in their precondition phase states and only if the latch circuit's digital output signal is latched to a voltage on the buffer circuit output indicative of a HIGH driver output voltage.

22. The driver circuit as set forth in claim 21, wherein the first and second clock signals are derived from the global clock signal.

23. The driver circuit as set forth in claim 22, wherein the first and second clock signals are in phase with each other.

24. The driver circuit as set forth in claim 22, wherein the driver circuit is responsive to a first data enable signal having first and second states and is responsive to a second data enable signal having first and second states, wherein the first clock signal stays in its drive phase state only if the first data enable signal is in its first state and the second clock signal stays in its drive phase state only if the second data enable signal is in its first state.

25. The driver circuit as set forth in claim 20, wherein the pullup transistor is a pMOSFET and the pulldown transistor is a nMOSFET.

26. The driver circuit as set forth in claim 21, wherein the pullup transistor is a pMOSFET and the pulldown transistor is a nMOSFET.

27. The driver circuit as set forth in claim 21, further comprising:
a precondition charging transistor, wherein the precondition charging transistor is OFF only if the second clock signal is in its drive phase state, the precondition charging transistor is ON to switch the pullup transistor ON only if the second clock signal is in its precondition phase state and only if the latch circuit's digital output signal is latched to a voltage on the buffer circuit output indicative of a LOW driver output voltage, and the precondition charging transistor is OFF only if the second clock signal is in its precondition phase and only if the latch circuit's digital output signal is latched to a voltage on the buffer circuit output indicative of a HIGH driver output voltage; and
a precondition discharging transistor, wherein the precondition discharging transistor is OFF only if the second clock signal is in its drive phase state, the precondition discharging transistor is ON to switch the pulldown transistor ON only if the second clock signal is in its precondition phase state and only if the latch circuit's digital output signal is latched to a voltage on the buffer circuit output indicative of a HIGH driver output voltage, and the precondition discharging transistor is OFF only if the second clock signal is in its precondition phase state and only if the latch circuit's digital output signal is latched to a voltage on the buffer circuit output indicative of a LOW driver output voltage.

28. The driver circuit as set forth in claim 27, wherein the pullup transistor and precondition charging transistor are pMOSFETs and the pulldown transistor and precondition discharging transistor are nMOSFETs.

29. A driver circuit having an input to receive a digital data signal and having a driver output, the driver circuit comprising:

a pullup transistor to drive the output toward HIGH only if ON;
a pulldown transistor to drive the output toward LOW only if ON, wherein the driver output is driven in response to the digital data signal only if a first clock signal and a second clock signal are each in a drive phase;
a buffer circuit, having an output, connected to the driver output to provide on the buffer circuit output a voltage indicative of the driver output voltage only if a global clock signal is in a drive phase and to provide on the buffer circuit output an open circuit only if the global clock signal is in a precondition phase;
a latch circuit to generate a digital output signal, the digital output signal being latched to the buffer circuit's output voltage only if the second clock signal transitions from a drive phase to a precondition phase; and
a precondition circuit to hold the pullup transistor ON and the pulldown transistor OFF to drive the driver output to a first voltage between HIGH and LOW only if the first and second clock signals are each in a precondition phase and only if the latch circuit's digital output signal is latched to a voltage on the buffer circuit output indicative of a LOW driver output voltage, and to hold the pullup transistor OFF and the pulldown transistor ON to drive the driver output to a second voltage between HIGH and LOW only if the first and second clock signals are each in a precondition phase and only if the latch circuit's digital output signal is latched to a voltage on the buffer circuit output indicative of a HIGH driver output voltage.

30. The driver circuit as set forth in claim 29, wherein the pullup transistor is a pMOSFET and the pulldown transistor is a nMOSFET.

31. The driver circuit as set forth in claim 29, wherein the first and second clock signals are derived from the global clock signal.

32. The driver circuit as set forth in claim 30, wherein the first and second clock signals are derived from the global clock signal.

33. The driver circuit as set forth in claim 29, further comprising:
a precondition charging transistor, wherein the precondition charging transistor is OFF only if the second clock signal is in a drive phase, the precondition charging transistor is ON to switch the pullup transistor ON only if the second clock signal is in a precondition phase and only if the latch circuit's digital output signal is latched to a voltage on the buffer circuit output indicative of a LOW driver output voltage, and the precondition charging transistor is OFF only if the second clock signal is in a precondition phase and only if the latch circuit's digital output signal is latched to a voltage on the buffer circuit output indicative of a HIGH driver output voltage; and
a precondition discharging transistor, wherein the precondition discharging transistor is OFF only if the second clock signal is in a drive phase, the precondition discharging transistor is ON to switch the pulldown transistor ON only if the second clock signal is in a precondition phase and only if the latch circuit's digital output signal is latched to a voltage on the buffer circuit output indicative of a HIGH driver output voltage, and the precondition discharging transistor is OFF only if the second clock signal is in a precondition phase and only if the latch circuit's digital output signal is latched to a voltage on the buffer circuit output indicative of a LOW driver output voltage.

34. The driver circuit as set forth in claim 33, wherein the pullup and precondition charging transistors are pMOSFETs and the pulldown and precondition discharging transistors are nMOSFETs.

35. The driver circuit as set forth in claim 34, wherein:
the pullup transistor has its gate and drain connected, respectively, to the source and drain of the precondition charging transistor; and
the pulldown transistor has its gate and source connected, respectively, to the drain and source of the precondition discharging transistor.

36. A driver circuit to drive a bus in response to a digital data signal, the driver circuit comprising:
a pullup pMOSFET with a drain connected to the bus and a source coupled to a power supply;
a pulldown nMOSFET with a drain connected to the bus and a source coupled to ground;
a first transmission gate coupled to the gate of the pullup pMOSFET to switch the pMOSFET ON only if a first clock signal and a second clock signal are each in a drive phase and the digital data signal is in a first state;
a second transmission gate coupled to the gate of the pulldown nMOSFET to switch the nMOSFET ON only if the first and second clock signals are each in a drive phase and the digital data signal is in a second state;
a precondition charging pMOSFET with a source connected to the gate of the pullup pMOSFET and a drain connected to the bus;
a precondition discharging nMOSFET with a drain connected to the bus and a source connected to gate of the pulldown nMOSFET;
a buffer circuit having an output and connected to the bus to provide on its output an open circuit only if a global clock signal is in a precondition phase and to provide on its output a voltage indicative of the bus voltage only if the global clock signal is in a drive phase; and
a latch circuit having an output and having an input connected to the buffer circuit output, the latch circuit input having an input voltage equal to the buffer circuit's output voltage, the latch circuit to latch its output to the voltage of its input only if the second clock signal transitions from a drive phase to a precondition phase; and
a precondition circuit connected to the latch circuit and having a charging line connected to the gate of the precondition charging pMOSFET and having a discharging line connected to the gate of the precondition discharging nMOSFET, wherein the charging line is HIGH and the discharging line is LOW only if the second clock signal is in a drive phase, wherein the charging and discharging lines are at a voltage that maps into the logical complement of the Boolean element which the latch circuit's output voltage maps into only if the second clock signal is in a precondition phase.

37. The driver circuit as set forth in claim 36, further comprising:
a first switching pMOSFET having a source connected to the source of the pullup pMOSFET, having a drain connected to the gate of the pullup pMOSFET, and having a gate coupled to the discharging line so that the logical level of its gate is the complement of the logical level of the discharging line only if a tristate signal is in a first state, wherein the first switching pMOSFET is ON only if the tristate signal is in a second state; and
a second switching nMOSFET having a source connected to the source of the pulldown nMOSFET, having a drain connected to the gate of the pulldown nMOSFET, and having a gate coupled to the charging line so that the logical level of its gate is the complement of the logical level of the charging line only if the tristate signal is in the first state, wherein the second switching nMOSFET is ON only if the tristate signal is in the second state.

38. A method for driving a bus according to a digital data signal, the method comprising the steps of:
providing a global clock signal having a precondition phase and a drive phase;
providing first and second clock signals derived from the global clock signal, the first and second clock signals having precondition and drive phases;
providing a pullup transistor to drive the bus HIGH and a pulldown transistor to drive the bus LOW so that the bus is driven in response to the digital data signal when the first and second clock signals are in their drive phases; and
when the first clock signal is in precondition phase j and the second clock signal is in precondition phase j, where j is an integer for counting clock cycles of the global, first, and second clock signals so that a cycle contains exactly one precondition phase and one drive phase and begins at the beginning of a precondition phase and ends at the end of a drive phase:
holding the pullup transistor ON and the pulldown transistor OFF to charge the bus to a first voltage when the bus voltage was LOW when the global clock signal transitioned from drive phase j−1 to precondition phase j; and
holding the pullup transistor OFF and the pulldown transistor ON to discharge the bus to a second voltage when the bus voltage was HIGH when the global clock signal transitioned from drive phase j−1 to precondition phase j.

39. The method as set forth in claim 38, wherein the first and second voltages are greater than LOW and less than HIGH.

* * * * *